(12) United States Patent
Jeong

(10) Patent No.: US 7,372,700 B2
(45) Date of Patent: May 13, 2008

(54) PLASMA DISPLAY DEVICE

(75) Inventor: Woo-Man Jeong, Suwon-si (KR)

(73) Assignee: Samsung SDI Co., Ltd. (KR)

( * ) Notice: Subject to any disclaimer, the term of this patent is extended or adjusted under 35 U.S.C. 154(b) by 117 days.

(21) Appl. No.: 11/354,545

(22) Filed: Feb. 14, 2006

(65) Prior Publication Data

US 2006/0187644 A1 Aug. 24, 2006

(30) Foreign Application Priority Data

Feb. 24, 2005 (KR) ........................ 10-2005-0015327

(51) Int. Cl.
*H05K 7/20* (2006.01)
(52) U.S. Cl. .................. 361/704; 345/60; 313/46; 313/582; 257/705; 257/710; 349/59; 349/149
(58) Field of Classification Search ................ 136/242, 136/203, 205; 349/149, 150; 313/495, 581, 313/582, 46, 587; 361/700, 704, 679, 681, 361/724, 728, 736, 748, 752; 315/169.4; 345/60

See application file for complete search history.

(56) References Cited

U.S. PATENT DOCUMENTS

| | | | | |
|---|---|---|---|---|
| 5,831,374 A * | 11/1998 | Morita et al. | ................ | 313/46 |
| 5,971,566 A * | 10/1999 | Tani et al. | ................ | 362/294 |
| 6,163,350 A * | 12/2000 | Ihara | ................ | 349/58 |
| 6,411,353 B1 * | 6/2002 | Yarita et al. | ................ | 349/59 |
| 6,411,359 B1 * | 6/2002 | Kobayashi et al. | ......... | 349/149 |
| 6,657,620 B2 * | 12/2003 | Oishi et al. | ................ | 345/204 |
| 6,700,315 B2 * | 3/2004 | Kim et al. | ................ | 313/46 |
| 6,774,543 B2 * | 8/2004 | Kim et al. | ................ | 313/46 |
| 6,801,195 B2 * | 10/2004 | Yoshida | ................ | 345/204 |
| 6,813,159 B2 * | 11/2004 | Irie et al. | ................ | 361/752 |
| 6,856,076 B2 * | 2/2005 | Kim et al. | ................ | 313/46 |
| 6,979,243 B2 * | 12/2005 | Watanabe | ................ | 445/24 |
| 7,038,360 B2 * | 5/2006 | Bae et al. | ................ | 313/46 |
| 7,196,750 B2 * | 3/2007 | Koo et al. | ................ | 349/59 |
| 7,218,521 B2 * | 5/2007 | Kim | ................ | 361/704 |
| 7,224,121 B2 * | 5/2007 | Ahn | ................ | 313/582 |
| 7,235,927 B2 * | 6/2007 | Yoo | ................ | 313/586 |
| 2005/0099106 A1 * | 5/2005 | Kim et al. | ................ | 313/46 |
| 2005/0122019 A1 * | 6/2005 | Bae | ................ | 313/46 |
| 2005/0194900 A1 * | 9/2005 | Kim et al. | ................ | 313/582 |
| 2005/0258749 A1 * | 11/2005 | Ahn | ................ | 313/582 |
| 2005/0286228 A1 * | 12/2005 | Kim | ................ | 361/704 |
| 2006/0186779 A1 * | 8/2006 | Kim et al. | ................ | 313/46 |
| 2006/0290251 A1 * | 12/2006 | Shives et al. | ................ | 313/46 |
| 2007/0008243 A1 * | 1/2007 | Jeong | ................ | 345/60 |
| 2007/0052335 A1 * | 3/2007 | Shin | ................ | 313/46 |

FOREIGN PATENT DOCUMENTS

| | | |
|---|---|---|
| JP | 2002-198475 | 7/2002 |
| KR | 10-2002-0021481 A | 3/2002 |

\* cited by examiner

*Primary Examiner*—Jayprakash Gandhi
*Assistant Examiner*—Courtney L Smith
(74) *Attorney, Agent, or Firm*—Knobbe Martens Olson & Bear LLP

(57) ABSTRACT

A plasma display device which has improved performance of heat dissipation and noise/vibration insulation is disclosed. In one embodiment, the plasma display device includes a plasma display panel, a first base member coupled with the plasma display panel, a second base member connected to the first base member, and a thermally conductive cushion member interposed between the first base member and the second base member.

20 Claims, 4 Drawing Sheets

PLASMA DISPLAY DEVICE

CROSS-REFERENCE TO RELATED APPLICATION

This application claims the benefit of Korean Patent Application No. 10-2005-0015327 filed in the Korean Intellectual Property Office on Feb. 24, 2005, the disclosure of which is incorporated herein by reference.

BACKGROUND OF THE INVENTION

1. Field of the Invention

The present invention relates to a plasma display device. More particularly, the present invention relates to a plasma display device which has improved performance of heat dissipation and noise/vibration insulation.

2. Description of the Related Technology

Generally, a plasma display panel (PDP) displays an image by exciting phosphorus with ultraviolet (UV) rays. The UV rays are generated by a gas discharge in a vacuum discharge cell. The PDP provides a wide screen in a slim and light-weight design. In addition, the PDP has high performance in display capacity, brightness, contrast, and viewing angle.

A plasma display device typically includes a plasma display panel for displaying an image, a chassis base supporting the PDP, a plurality of drive boards, and a housing. The drive boards are mounted on a surface of the chassis base opposite from a surface supporting the PDP. The housing is configured to enclose the PDP, the chassis base, and the drive boards. The housing typically has a front cover and a back cover which are detachable with each other.

A heat-dissipating sheet may be inserted between the PDP and the chassis base. The heat-dissipating sheet is configured to transfer heat emitting from the PDP to the chassis base. The chassis base in turn dissipates the heat outside the plasma display device through holes of the back cover.

During operation of the plasma display device, substantial noise and vibration are also generated due to an electrostatic force between electrodes in the PDP. A high current flowing through circuit elements on the drive boards also generates noise and vibration during the operation of the plasma display device.

A conventional plasma display device includes a chassis base and a PDP, the surfaces of which are attached to the heat-dissipating sheet. Accordingly, noise and vibration generated from the PDP are transferred to the drive boards through the chassis base. The noise and vibration from the PDP may be further amplified on the drive boards In addition, the heat-dissipating sheet may not efficiently dissipate heat emitting from the PDP.

SUMMARY OF CERTAIN INVENTIVE ASPECTS

One aspect of the invention provides a plasma display device. The plasma display device comprises a plasma display panel, a first base member coupled with the plasma display panel, a second base member connected to the first base member; and a thermally conductive cushion member interposed between the first base member and the second base member.

Edges of the first base member are coupled with edges of the second base member.

Additionally, the first base member comprises an accommodating part configured to house the thermally conductive cushion member.

Additionally, the first base member comprises a bonding part configured to couple with the second base member.

Additionally, the thermally conductive cushion member is formed from either a rubber material or a silicon-containing material.

Additionally, the first base member is in contact with the thermally conductive cushion member.

Additionally, the second base member is in contact with the thermally conductive cushion member.

The plasma display device may further comprise drive circuits, wherein the drive circuits are mounted on the second base member.

The plasma display device may further comprise a bonding material, wherein the bonding material is provided between edges of the plasma display panel and the second base member.

Additionally, the first base member and the second base member are formed from a metal, wherein the metal is aluminum or an alloy thereof.

Additionally, the first base member is formed from a rubber or a silicon-containing material.

Additionally, the second base member comprises a plurality of elongated sheet members and wherein the elongated sheet members are spaced apart from each other at a predetermined interval.

The plasma display device may further comprise drive circuits, wherein the drive circuits are mounted on the second base member.

A method of dissipating heat emitting from a plasma display device comprises transferring heat from a plasma display panel to a first base member, transferring the heat from the first base member to a thermally conductive member, transferring the heat from the thermally conductive member to a second base member; and dissipating the heat from the second base member.

The method may further comprise directly transferring at least a portion of the heat from the first base member to the second base member.

A plasma display device comprises a plasma display panel having a substantially planar surface, a chassis comprising a first chassis member and a second chassis member integrated with each other while having a gap therebetween, the first chassis member having a first surface contacting the surface of the plasma display panel, and a heat conductive sheet interposed in the gap formed between the first and the second chassis members.

Additionally, the first chassis member further comprises a second surface facing the second chassis member, and wherein the second surface substantially contacts the heat conductive sheet.

Additionally, the second surface contacts the heat conductive sheet in substantially all area of the second surface.

Additionally, the surface of the plasma display panel and the first surface contact each other across substantially the entire first surface.

BRIEF DESCRIPTION OF THE DRAWINGS

Aspects and advantages of the invention will become apparent and more readily appreciated from the following description, taken in conjunction with the accompanying drawings.

DETAILED DESCRIPTION OF CERTAIN INVENTIVE EMBODIMENTS

Figure 1:
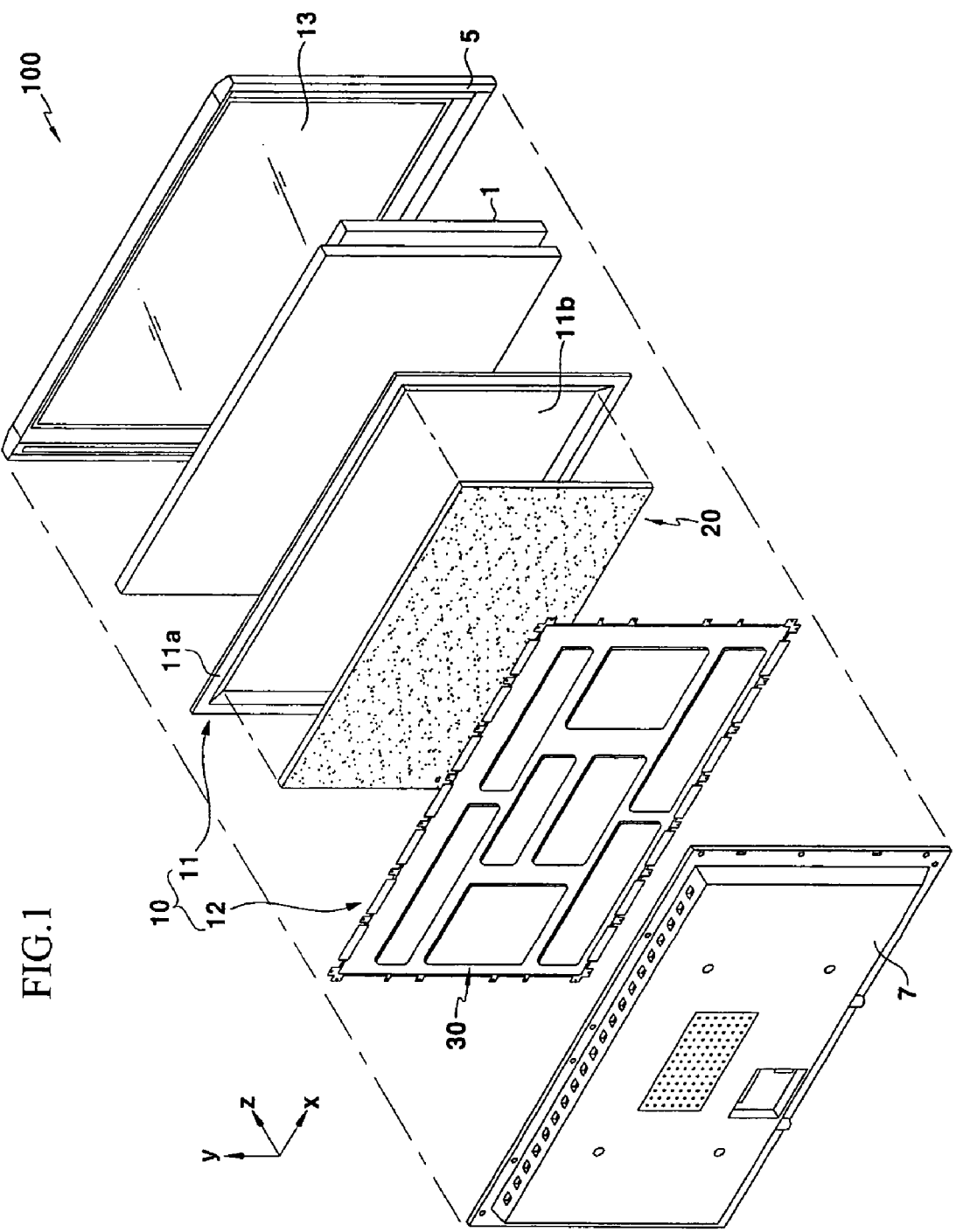
FIG. 1 is a schematic exploded perspective view of a plasma display device according to an embodiment of the invention.

A plasma display device according to embodiments of the invention will be described in detail with reference to the foregoing drawings. In the drawings, like reference numerals indicate identical or functionally similar elements.

Figure 2:
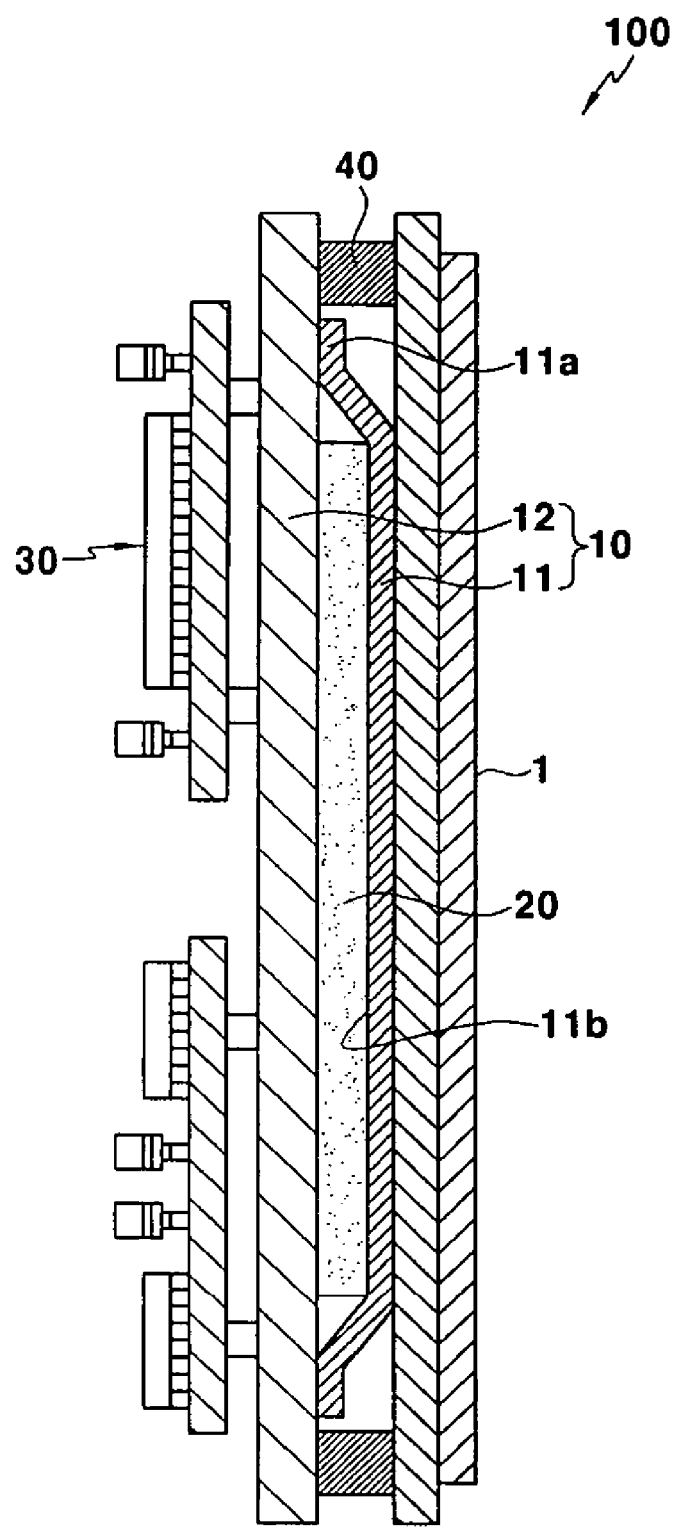
FIG. 2 is a schematic cross-sectional side view of the plasma display device of FIG. 1 in assembled state.

Referring to FIGS. 1 and 2, a plasma display device according to an embodiment of the invention is described. In FIG. 1, the plasma display device 100 includes a front cover 5, a PDP 1, a chassis base 10, drive circuits 30, and a back cover 7, all of which are positioned in parallel to each other. The PDP 1 is configured to display an image on a front surface (not shown) facing the front cover 13. The chassis base 10 is positioned on the opposite side of the PDP 1 from the front cover 5. In the assembled configuration, a surface of the chassis base 10 contacts a non-image-displaying or back surface of the PDP 1. The drive circuits 30 are mounted on the opposite surface of the chassis base 10. The drive circuits 30 are configured to provide signals for driving the PDP 1.

In the illustrated embodiment, the front cover 5 is positioned at the front or image-displaying side of the PDP 1. The back cover 7 is positioned at the rear side of the chassis base 10.

The front cover 5 and the back cover 7 are coupled with the chassis base 10 using screws (not shown). The covers 5, 7 form a housing enclosing the PDP 1 and the chassis base 10.

In the embodiment, the front cover 5 has a filter 13 at the front side of the PDP 1. The filter 13 is substantially transparent to allow light from the PDP 1 to pass through. However, the filter 13 is configured to shield a viewer from electromagnetic waves emitted from the PDP 1.

As shown in FIG. 1, the PDP 1 generally has a rectangular shape which has a width greater than its height. For example, the PDP 1 may have an aspect ratio of 16:9.

The chassis base 10 is configured to have sufficient mechanical strength to support the PDP 1. The chassis base 10 is also configured to have a structure for effectively reducing or dissipating heat, noise, and EMI generated by the PDP 1 as will be described below in detail.

In the illustrated embodiment, the chassis base 10 includes a first base member 11 and a second base member 12. The first base member 11 faces and contacts the back side of the PDP 1. The second base member 12 is positioned on the opposite side of the first base member 11 from the PDP 1. The second base member 12 is coupled with the first base member 11 at its edges.

The first base member 11 has a bonding part 11a and an accommodating part 11b. In the illustrated embodiment, the bonding part 11a is formed at the four edges of the first base member 11. The bonding part 11a extends along the entire perimeter of the base member 11. In other embodiments, the bonding part may be formed along only part of the perimeter of the first base member. The bonding part 11a has a width which is sufficient to enable coupling with the second base member 12.

In addition, the first base member 11 has an accommodating part 11b for housing a thermally conductive cushion member 20. In the illustrated embodiment, the accommodating part 11b is surrounded by the bonding part 11a at the four edges. The accommodating part 11b is recessed toward the PDP 1 and provides a space for the thermally conductive cushion member 20. The accommodating part 11b has a contact surface which faces and contacts the thermally conductive cushion member 20. The contact surface is on the opposite side from a surface facing and contacting the PDP 1.

The second base member 12 is in a shape of a rectangular plate corresponding to the shape of the PDP 1. The edges of the second base member 12 are coupled with the bonding part 11a of the first base member 11.

The second base member 12, coupled with the first base member 11, is configured to enclose the thermally conductive cushion member 20. The space enclosed by the first and the second base members 11 and 12 is also referred to as an installation space in this description.

In the illustrated embodiment, the edges of the second base member 12 and the bonding part 11a of the first base member 11 may be coupled to each other by a method such as welding, screwing, riveting, gluing, bolting, and TOX® clinching, for example.

In one embodiment, the first and the second base members 11 and 12 may be formed of a material having excellent thermal conductivity and high rigidity. An exemplary material is a metal such as aluminum.

In another embodiment, the first base member 11 may be formed of an elastic material such as rubber while the second base member 12 is formed of metal. This configuration prevents noise and vibration from traveling between the PDP 1 and the drive circuits 30.

In other embodiments, the first base member 11 may be formed of a silicon-containing material which has a high thermal conductivity and is capable of blocking noise and vibration.

A plurality of drive circuits 30 are mounted on the second base member 12 and fixed using a conventional coupling technique such as screws. The drive circuits 30 are mounted on a surface opposite from a surface facing the thermally conductive cushion member 20.

Referring to FIG. 2, a bonding material 40 is provided between edges of the PDP 1 and edges of the second base member 12. The bonding material 40 couples the PDP 1 with the second base member 12, enclosing the first base member 11 and the thermally conductive cushion member 20.

In one embodiment, the bonding material 40 may be formed of a conventional double-sided adhesive tape. The adhesive tape may have a base material with a predetermined elasticity.

According to an embodiment of the invention, the thermally conductive cushion member 20 is configured to efficiently transfer heat from the PDP 1 to the second base member 12, which in turn dissipates the heat outside. The thermally conductive member 20 may also block noise from either the PDP or the drive circuits 30.

The thermally conductive cushion member 20 is in a shape of a plate. The cushion member 20 is accommodated in the accommodating part 11b of the first base member 11. In addition, the cushion member 20 is enclosed and sandwiched by the first base member 11 and the second base member 12.

In one embodiment, the thermally conductive cushion member 20 may be formed of a rubber material. In another embodiment, the cushion member 20 may be formed of a silicon-containing material which has a high thermal conductivity and a high absorptivity of noise and vibration.

In operation, heat generated by the PDP 1 is first transferred to the first base member 11. Because the cushion member 20 has a high thermal conductivity, it can rapidly transfer the heat from the first base member 11 to the second base member 12. The second base member 12 then dissipates the heat outside through holes of the back cover 7. This configuration allows fast heat dissipation.

The cushion member 20 also reduces or blocks noise and vibration between the PDP 1 and the drive circuits 30. The cushion member 20 absorbs noise and vibration transferred via the first base member 11 from the PDP 1 and those transferred via the second base member 12 from the drive circuits 30.

Referring again to FIG. 2, the first base member 11 is configured to contact the PDP 1 on its surface. In addition, the first base member 11 is coupled with the second base member 12 at the bonding part 11*a*. In the illustrated embodiment, during the operation of the plasma display device 100, heat emitted from the PDP 1 is transferred to the first base member 11. Then, at least a portion of the heat is transferred directly to the second base member 12 through the bonding part 11*a*. The remaining portion of the heat is transferred indirectly to the second base member 12 via the thermally conductive cushion member 20.

In addition, during plasma display device operation, noise and vibration are generated by the PDP 1 due to an electrostatic force between electrodes. The noise and vibration are transferred to the thermally conductive cushion member 20 through the first base member 11 and are absorbed by the thermally conductive member 20.

Additionally, noise and vibration are also generated by the drive circuits 30 due to the electric current driving the PDP 1, which generates thermal-mechanical effects. The noise and vibration are transferred to the thermally conductive cushion member 20 through the second base member 12. They are absorbed by the thermally conductive cushion member 20.

In an embodiment in which the first base member 11 is formed of an elastic material such as rubber or silicon, the noise and vibration generated by the PDP 1 may also be absorbed by the first base member 11 even before being transferred to the thermally conductive cushion member 20. This configuration provides a more effective shielding of noise and vibration.

Figure 3:
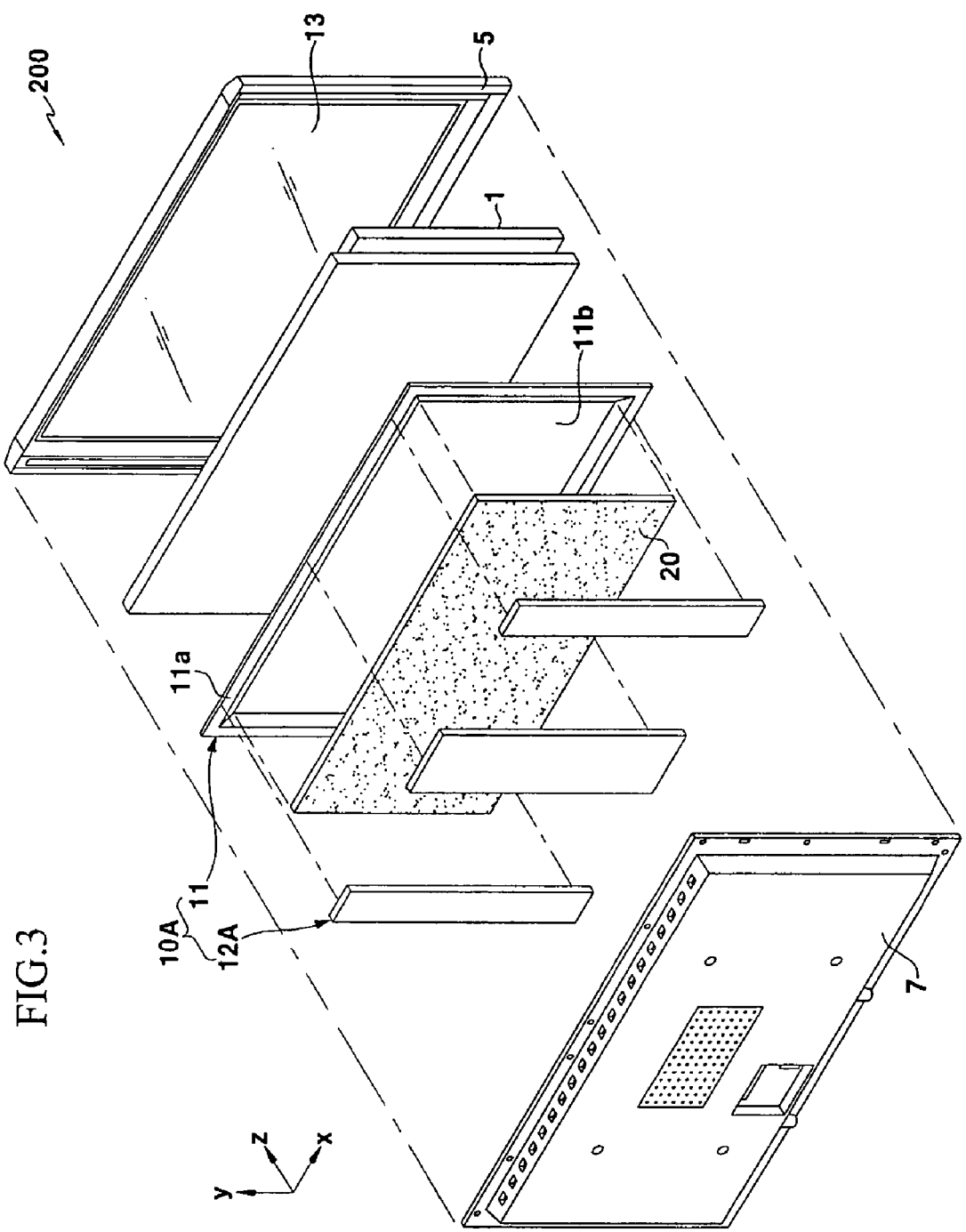
FIG. 3 is a schematic exploded perspective view of a plasma display device according to another embodiment of the invention.

FIG. 3 is an exploded perspective view of a plasma display device according to another embodiment of the invention. A detailed explanation for the components that have been already described above in connection with FIGS. 1 and 2 will be omitted.

In the illustrated embodiment, a plasma display device 200 has the same basic structure as that of the embodiment described above with reference to FIGS. 1 and 2 except for the chassis base 10A. The chassis base 10A has a plurality of second base members 12A instead of the single second base member 12 of FIG. 1. The plurality of the second base members 12A are in a form of an elongated sheet with a predetermined width and length. They are spaced apart from each other at a predetermined interval.

Figure 4:
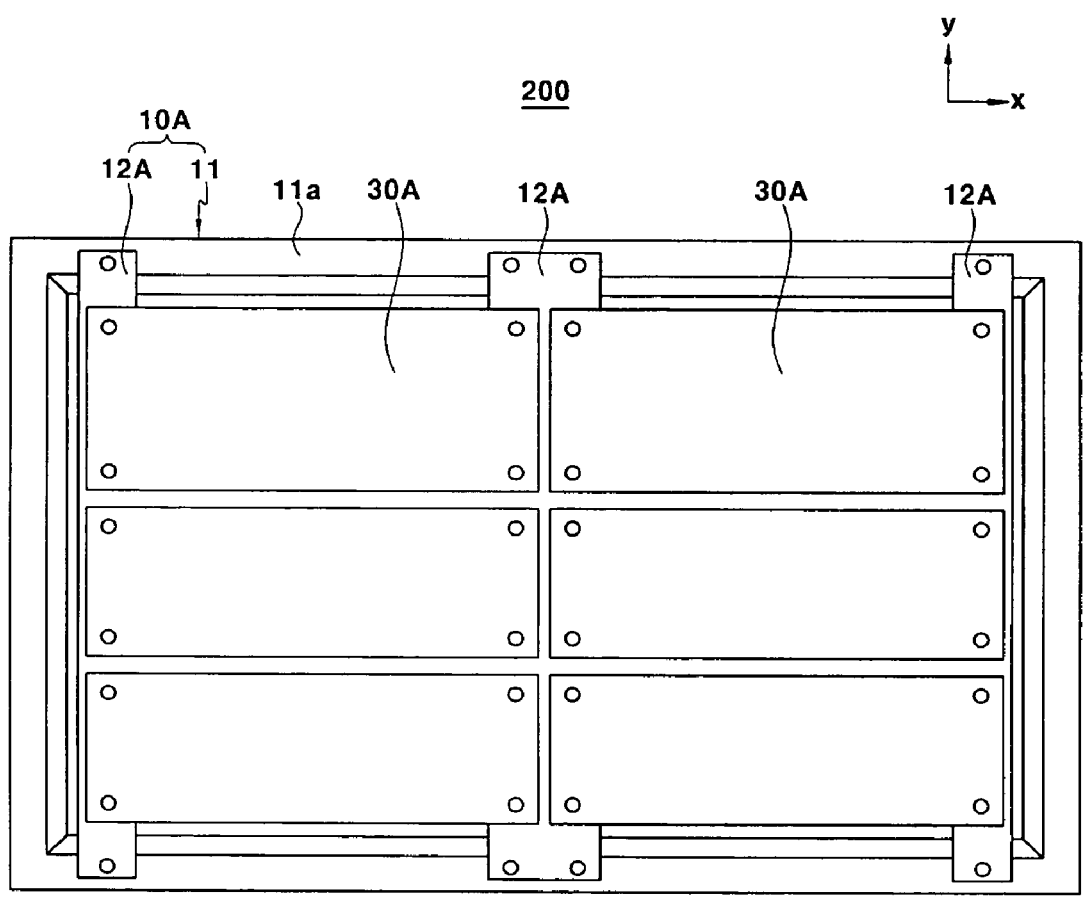
FIG. 4 is a schematic rear view of the chassis base in assembled state of FIG. 3.

FIG. 4 is a schematic rear view showing the chassis base of FIG. 3 in assembled state. Referring to FIG. 4, each of second base members 12A is formed in a form of an elongated sheet. The second base members 12A are positioned along the y-axis direction of the first base member 11 and are spaced apart from each other at a predetermined interval in the x-axis direction.

The second base members 12A are configured to tightly contact the thermally conductive cushion member 20. Both end portions of the second base members 12A are coupled to the bonding part 11*a* of the first base member 11.

A plurality of drive circuits 30A are mounted on the second base members 12A by conventional fixing means, such as screws. In the illustrated embodiment, only edge portions of each of the drive circuits 30A are mounted on the second base members 12A.

The other elements of the plasma display device 200 are identical to those of the embodiment explained above with reference to FIGS. 1 and 2. Thus, detailed explanation will be omitted.

As described above, the plasma display device according to the embodiments includes a chassis base having a first base member and a second base member, and a thermally conductive cushion member sandwiched therebetween. Therefore, heat generated by a PDP is effectively transferred and dissipated outside. In addition, noise and vibration are effectively blocked between a PDP and drive circuits by the cushion member.

Although various embodiments of the invention have been shown and described, it will be appreciated by those technologists in the art that changes might be made in these embodiments without departing from the principles and spirit of the invention, the scope of which is defined in the claims and their equivalents.

What is claimed is:

1. A plasma display device comprising:
   a plasma display panel;
   a first base member coupled with the plasma display panel;
   a second base member connected to the first base member; and
   a thermally conductive cushion member interposed between the first base member and the second base member,
   wherein the first base member comprises a first portion and a second portion, wherein the first portion is interposed between the plasma display panel and the thermally conductive cushion member, wherein the second portion is not interposed between the plasma display panel and the thermally conductive cushion member, wherein the second portion is connected to the second base member.

2. The plasma display device of claim 1, wherein edges of the first base member are coupled with edges of the second base member.

3. The plasma display device of claim 1, wherein the first base member comprises an accommodating part configured to house the thermally conductive cushion member.

4. The plasma display device of claim 1, wherein the first base member comprises a bonding part configured to couple with the second base member.

5. The plasma display device of claim 1, wherein the thermally conductive cushion member is formed from either a rubber material or a silicon-containing material.

6. The plasma display device of claim 1, wherein the first base member is in contact with the thermally conductive cushion member.

7. The plasma display device of claim 1, wherein the second base member is in contact with the thermally conductive cushion member.

8. The plasma display device of claim 1, further comprising drive circuits, wherein the drive circuits are mounted on the second base member.

9. The plasma display device of claim 1, further comprising a bonding material, wherein the bonding material is provided between edges of the plasma display panel and the second base member.

10. The plasma display device of claim 1, wherein the first base member and the second base member are formed from a metal.

11. The plasma display device of claim 10, wherein the metal is aluminum or an alloy thereof.

12. The plasma display device of claim 1, wherein the first base member is formed from a rubber or a silicon-containing material.

13. The plasma display device of claim 1, wherein the second base member comprises a plurality of elongated sheet members and wherein the elongated sheet members are spaced apart from each other at a predetermined interval.

14. The plasma display device of claim 13, further comprising drive circuits, wherein the drive circuits are mounted on the second base member.

15. A method of dissipating heat emitting from a plasma display device comprising: providing a plasma display device, which comprises a plasma display panel, a first base member, a thermally conductive member and a second case member, wherein the thermally conductive member is interposed between the first and second base members, wherein the first base member comprises a first portion and a second portion, wherein the first portion is interposed between the plasma display panel and the thermally conductive cushion member, wherein the second portion is not interposed between the plasma display panel and the thermally conductive cushion member, wherein the second portion is connected to the second base member; transferring heat from the plasma display panel to the first base member; transferring heat from the first base member to the thermally conductive member; transferring the heat from the thermally conductive member to the second base member; and dissipating the heat from the second base member.

16. The method of claim 15, further comprising directly transferring at least a portion of the heat from the first base member to the second base member.

17. A plasma display device comprising:
a plasma display panel having a substantially planar surface;
a chassis comprising a first chassis member and a second chassis member integrated with each other while having a gap therebetween, the first chassis member having a first surface contacting the surface of the plasma display panel; and
a heat conductive sheet interposed in the gap formed between the first and the second chassis members,
wherein the first chassis member comprises a first portion and a second portion, wherein the first portion is interposed between the plasma display panel and the heat conductive sheet, wherein the second portion is not interposed between the plasma display panel and the heat conductive sheet, wherein the second portion is connected to the second chassis member.

18. The plasma display device of claim 17, wherein the first chassis member further comprises a second surface facing the second chassis member, and
wherein the second surface substantially contacts the heat conductive sheet.

19. The plasma display device of claim 18, wherein the second surface contacts the heat conductive sheet in substantially all area of the second surface.

20. The plasma display device of claim 17, wherein the surface of the plasma display panel and the first surface contact each other across substantially the entire first surface.

* * * * *